United States Patent [19]

Bory et al.

[11] 4,160,961

[45] Jul. 10, 1979

[54] PRINTED WIRING BOARD MOUNTING AND INTERCONNECTION OF COAXIAL CABLE TRANSFORMERS AND THE LIKE

[75] Inventors: Richard A. Bory; Alexander F. Hogg, both of Scottsdale, Ariz.

[73] Assignee: Motorola, Inc., Schaumburg, Ill.

[21] Appl. No.: 818,049

[22] Filed: Jul. 22, 1977

[51] Int. Cl.$^2$ .......................... H01P 5/10; H01P 3/06; H05K 1/18; H05K 1/10

[52] U.S. Cl. ..................................... 333/27; 174/68.5; 333/260; 361/405

[58] Field of Search ................... 333/97 R, 32, 33, 35, 333/24 R, 82 B, 25, 27, 26, 84 R, 21 R, 84 M; 361/397–409, 395, 422; 343/859; 174/68.5, 71 C, 88 C, 75 C

[56] References Cited

U.S. PATENT DOCUMENTS

| | | | |
|---|---|---|---|
| 3,614,676 | 10/1971 | Boelke | 333/26 |
| 3,996,416 | 12/1976 | Lemke | 361/397 X |

FOREIGN PATENT DOCUMENTS

| | | | |
|---|---|---|---|
| 609559 | 10/1948 | United Kingdom | 333/26 |

*Primary Examiner*—Alfred E. Smith
*Assistant Examiner*—Marvin Nussbaum
*Attorney, Agent, or Firm*—M. David Shapiro; Eugene A. Parsons

[57] ABSTRACT

A system of shaping, mounting, and interconnecting Radio Frequency Coaxial cable transformers on a printed wiring board to minimize inductance of the interconnections for use at very high and ultra high frequencies.

2 Claims, 6 Drawing Figures

PRINTED WIRING BOARD MOUNTING AND INTERCONNECTION OF COAXIAL CABLE TRANSFORMERS AND THE LIKE

FIELD OF THE INVENTION

The invention relates to systems and methods for interconnecting the ends of short lengths of coaxial cables used in R.F. transformers and the like to provide very low reactance in the interconnections while at the same time providing a high level of mechanical integrity and good quality control in the transformers by means of printed wiring board mounting techniques.

BACKGROUND OF THE INVENTION

C. L. Rutheroff revealed designs for transmission line transformers in, "Some Broadband Transformers", Proceedings of the IRE, Volume 47, August 1959, pp 1337–1342. These devices had very wide bandwidth characteristics, some ratios as high as 20,000:1. Frequency ranged from a few tens of kilohertz to over one thousand megahertz. While the devices described in Rutheroff's paper were made of twisted pair transmission lines wound on ferrite torroids, it was there suggested that any kind of a transmission line might be used. The 4:1 impedance transformer circuit of FIG. 1 is representative of the sort of transformer which Rutheroff converted to transmission line form. Rutheroff, supra at p. 1338. The advantage of the devices described were stated as follows: "In transmission line transformers, the coils are so arranged that the interwinding capacity is a component of the characteristic impedance of the line, and as such forms no resonances which seriously limit the bandwidth." Rutheroff, Supra, at p. 1337.

O. Pitzalis, Jr. and T. P. M. Couse published, "Broadband Transformer Design for RF Transistor Power Amplifiers", in the Electronics Components Conference Proceedings, May 1968. This paper specifically suggested that short coaxial cable lengths could be utilized to build the transformers proposed by Rutheroff at the higher frequencies. Pitzalis et al further analyzed the circuits of FIGS. 1 and 4 (a 9:1 impedance matching transformer) among others.

Operation of these prior art transformer systems is degraded by inductance introduced in the interconnections between any two or more ends of the coaxial cable. The degradation is caused by the relatively high series reactance produced by even small inductance values at higher frequency ranges. In many applications it is a further requirement to provide a rugged mounting of the coaxial cable sections to prevent physical degradation or even destruction of the transformer component parts. Prior art coaxial cable R.F. transformers have suffered limitations in these areas.

SUMMARY OF THE INVENTION

These and other limitations and shortcomings of prior art coaxial cable R.F. transformers are overcome by the features of the instant invention. The coaxial cables are physically and electrically connected to a printed wiring board in such a way as to minimize the problems inherent in prior art apparatus.

Therefore, according to one aspect of the invention, coaxial cable lengths are shaped and positioned so that ends which are to be interconnected are placed in mutual close proximity on a circuit board in order to reduce the inductive component in the interconnections therebetween.

According to another aspect of the invention, in a printed wiring board mounted transformer, the center conductor of a cable end may be connected to an outer conductor of another cable end with minimum inductive reactance introduced in the connection by means of a plated through circuit hole in the printed wiring board.

According to still another aspect of the invention, in a printed wiring board mounted coaxial cable transformer, all of the interconnections between two coaxial cable ends may be made on one side of the printed wiring board by the use of bracket mounting means for mounting and interconnecting the outer conductors while using a printed circuit on the same side of the printed wiring board to accomplish the interconnections between the inner conductors.

These and other aspects of the invention will be more readily understood upon consideration of the detailed description of the invention and the drawings, a description of which follows.

DETAILED DESCRIPTION OF THE INVENTION

Figure 1:
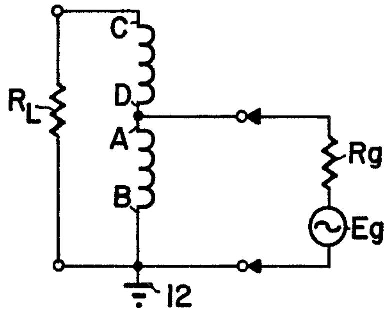
FIG. 1 (PRIOR ART)
FIG. 1 depicts a schematic diagram of a prior art 4:1 impedance matching device of the autotransformer type.
Figure 2:
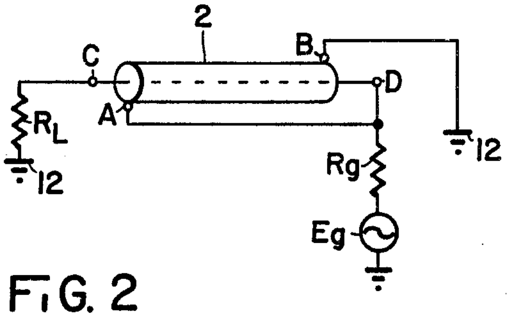
FIG. 2 (PRIOR ART)
FIG. 2 shows a pictorial diagram of a prior art coaxial cable version of the impedance matching transformer of FIG. 1.
Figure 3:
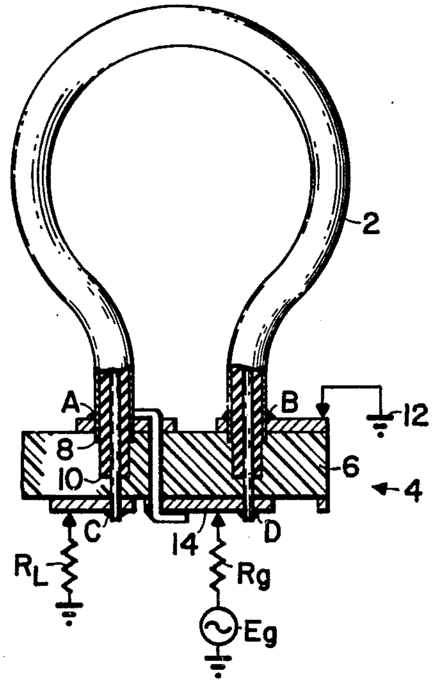
FIG. 3 is a pictorial/schematic representation of the invention as embodied to provide the 4:1 impedance transformation of FIGS. 1 and 2 at higher frequencies.

FIG. 3 depicts the invention implemented in a 4:1 impedance matching transformer configuration as is shown in FIG. 1 in schematic diagram form. Reference to the pictorial diagram of FIG. 2 will aid understanding of FIG. 3. (Like reference numerals are used for like items throughout the drawings.)

The invention as shown in FIG. 3 comprises "omega" shaped coaxial cable 2, which may be rigid, mounted on printed wiring board 4. Printed wiring board 4 is surfaced with two wiring means layers in conventional fashion. The shape of coaxial cable 2 is such that the ends of cable 2 are located in relatively close proximity, each to the other. The upper wiring layer at the points of contact with cable 2 is drilled or otherwise formed to accept the outer diameter of the outer conductor of cable 2 at points A and B. A portion of insulator 6 of wiring board 4 is also formed 8, by counterbore or otherwise, to accept a short length of the outer conductor of cable 2. Insulator 6 of board 4 is further counterbored 10 to fit the smaller diameter of the dielectric insulator of cable 2. Solder connections are made at A and B between the outer conductor of cable 2 and the upper wiring surface of board 4. (Like letter references in FIGS. 1, 2 and 3 refer to identical points in the circuit.) The inner conductor of cable 2 extends through board 4 at C and D and solder connections are there made to the lower wiring surface of board 4. Since printed wiring boards such as board 4 are typically in a thickness range near 1.5 millimeters, it will be clear that the length of inner conductor exposed beyond the outer conductor of cable 2 is very short and the series inductance in the extended portion of inner conductor is minimal.

The connection shown from point A to point D in FIG. 1 is the same as the connection shown between those points in FIGS. 2 and 3, as well. In FIG. 3 it may be seen that point A is above or on top of board 4 while point D is below or on the bottom of board 4. A plated through hole is therefore used to electrically connect lower circuit portion 14 to the pad soldered at A to the outer conductor of cable 2. Circuit portion 14 contains a solder pad to connect to the inner conductor of cable 2 at point D. This completes the circuit from A to D with a minimum circuit length and, thereby, a minimal circuit inductance. Load $R_L$ may be directly connected to a circuit pad in the lower wiring layer of board 4 to make the necessary connection to point C on one end. The other end of $R_L$ may be connected to ground, as shown schematically in FIG. 3.

The input generator is shown in FIG. 3 as a schematic equivalent circuit comprising generator equivalent resistance Rg and potential Eg. In practice, the generator may be physically located on printed wiring board 4, as will be well understood, but the schematic representations of FIG. 3 were chosen for clarity.

The outer conductor (at point B) of cable 2 must also be grounded as shown in FIGS. 1 and 2. This is accomplished according to this embodiment of the invention, by soldering it to ground plane 12 on the upper side of board 4, as shown in FIG. 3.

The embodiment of FIG. 3 provides extremely short interconnection circuit paths between the various elements of the impedance matching transformer as shown in the prior art drawings of FIGS. 1 and 2. The resulting very low series inductance and corresponding inductive reactance allows the matching device of FIG. 3 to be used at higher frequencies than was possible in prior art devices without encountering undue degradation in operation.

Figure 4:
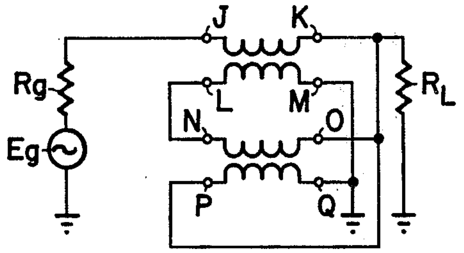
FIG. 4 (PRIOR ART)
FIG. 4 is a schematic diagram of a prior art 9:1 impedance matching transformer.
Figure 5:
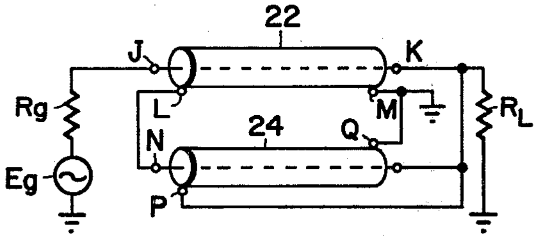
FIG. 5 (PRIOR ART)
FIG. 5 is a pictorial diagram of a prior art coaxial cable implementation of the transformer circuit of FIG. 4.
Figure 6:
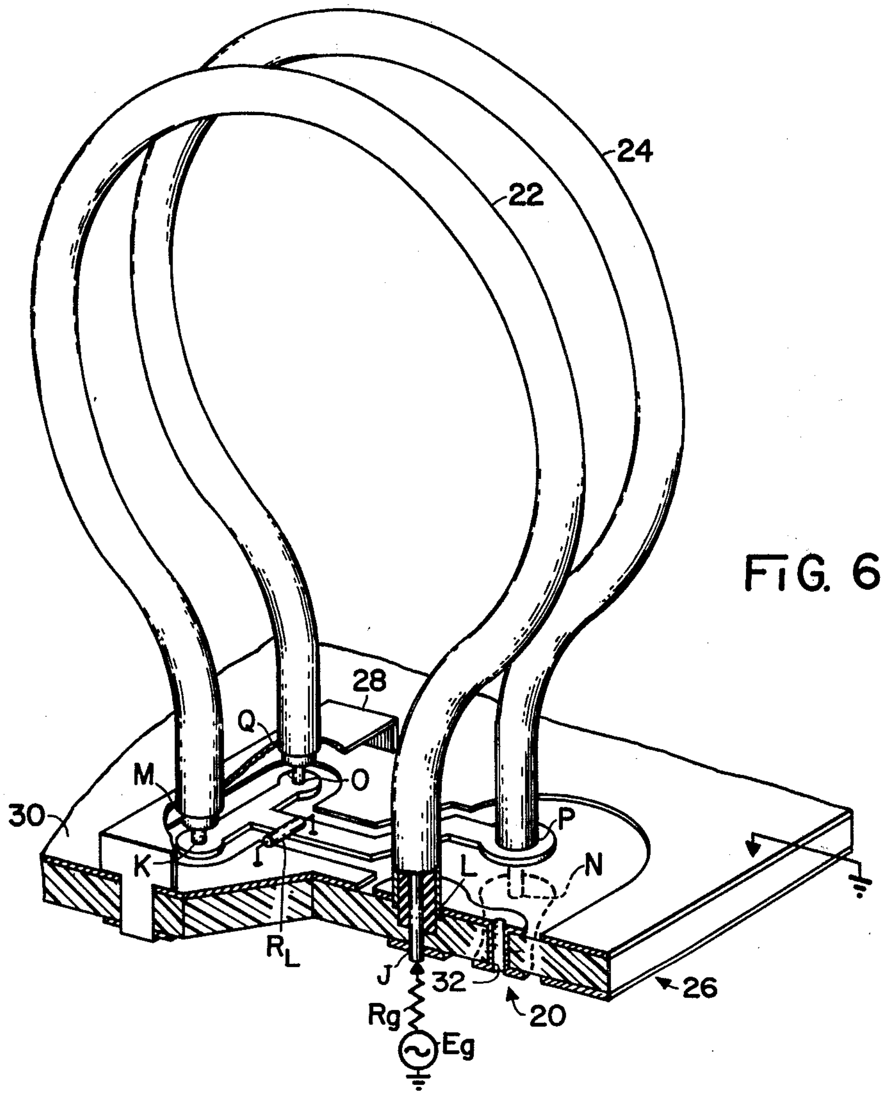
FIG. 6 is a pictorial/schematic representation of an embodiment of the invention providing the 9:1 impedance transformation of FIGS. 4 and 5.

Another prior art matching transformer schematic is shown in FIG. 4. This configuration yields a matching ratio of 9:1. As was the case in FIGS. 1, 2 and 3, like letter references in FIGS. 4, 5 and 6 refer to identical points in the circuit. FIG. 5 is a pictorial representation of the schematic of FIG. 4 where the circuit is implemented with two short lengths of coaxial cable 22, 24. As in the 4:1 transformer of FIG. 3, cables 22, 24 of FIG. 6 are shaped so that the ends may be closely spaced on printed wiring board 26. Two cables 22, 24 are also closely spaced so that all four ends are in close proximity. The outer conductors of cables 22, 24 are connected to bracket 28 at points M and Q. Bracket 28 may be chemically milled or otherwise fabricated. It is used to space the outer conductors of cables 22, 24 away from board 26 and to allow room for connection between the inner conductors of cables 22, 24 and board 26 at points K and O. Bracket 28 also serves to provide good electrical and mechanical connections to the outer conductors of cables 22, 24 from board 26. Bracket 28 may have lugs which extend through plated holes in board 26 so that bracket 28 may be soldered to the top or bottom (or both) of board 26. In FIG. 6, points M and Q are connected together by bracket 28 and bracket 28 is soldered to upper ground plane 30. Clearance holes are provided in board 26 so that the lugs of bracket 28 may go through board 26 and are also soldered to the lower side. If the copper cladding or other circuit means 30 is omitted around the vicinity of the lugs of bracket 28, there would be no connection to the upper circuit.

At the ends L and P of coaxial cables 22, 24, board 26 is counterbored for the outer conductors and the dielectric as before described for the 4:1 transformer of FIG. 1. The circuit connections for ends L, M and P, Q of FIG. 6 are otherwise also very similar to those described for the ends of cable 2, FIG. 1. Circuit 20, shown in phantom (a portion of the lower layer wiring means of board 26), is used to interconnect the center conductor at N to the outer conductor at L via plated through hole 32. Load resistor $R_L$ is connected at one end to board 26 at the common wiring track which connects to points K, O and P. At the other end, $R_L$ is grounded by wiring means 30. As in FIG. 3, Rg and Eg are shown schematically to preserve clarity; these equivalents would be replaced by practical circuitry either on or off of board 26 in the actual use of the invention.

Of course, $R_L$, as shown in either FIG. 3 or 6, may also be replaced with more practical circuits in actual use of the invention, as will be well understood by one having average skill in the art.

The 4:1 and 9:1 impedance matching transformers disclosed herein are typical examples of the use of the invention. Other uses include coaxial cable hybrid power adding networks and other matching networks.

Various other modifications and changes may be made to the present invention and other uses may be made of it based on the principles of the invention as described above without departing from the spirit and scope thereof, as encompassed in the claims which follow.

What is claimed is:

1. In a coaxial cable network an improvement comprising:

at least one predetermined length of coaxial cable having a first and a second end and having an inner and an outer conductor, said at least one coaxial cable being shaped so that two of said ends are in substantially the same plane and so that said two ends are essentially parallel and closely spaced; and a printed wiring board having wiring means on each of two opposite sides, said outer conductor at each of said two ends of said at least one coaxial cable are electrically and mechanically connected to one of said opposite sides, said inner conductor at each of said two ends of said at least one coaxial cable are electrically and mechanically connected to the other of said opposite sides, said inner conductor at one of said two ends being electrically connected to said outer conductor at the other of said two ends by means of a plated through hole in said printed wiring board to minimize the inductance in said electrical connection.

2. In a coaxial cable network an improvement comprising:

at least one predetermined length of coaxial cable having a first and a second end and having an inner and outer conductor, said at least one coaxial cable being shaped so that at least two of said ends are in substantially the same plane and so that said at least two ends are essentially parallel and closely spaced;

a printed wiring board having a near and a far side and having wiring means on at least said near side; and bracket means having a raised portion for electrically connecting said outer conductor at each of at least two of said ends each to the other and to said wiring means on said near side of said printed wiring board, said raised portion of said bracket means for spacing said outer conductor connections away from said near side of said printed wiring board, said inner conductor at each of said at least two ends being electrically connected to said wiring means on said near side of said printed wiring board, said electrical connections being arranged to minimize inductance in said electrical connections.

* * * * *